United States Patent
Yosui

(10) Patent No.: US 11,114,238 B2
(45) Date of Patent: Sep. 7, 2021

(54) MULTILAYER SUBSTRATE, STRUCTURE OF MULTILAYER SUBSTRATE MOUNTED ON CIRCUIT BOARD, METHOD FOR MOUNTING MULTILAYER SUBSTRATE, AND METHOD FOR MANUFACTURING MULTILAYER SUBSTRATE

(71) Applicant: Murata Manufacturing Co., Ltd., Nagaokakyo (JP)

(72) Inventor: Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 489 days.

(21) Appl. No.: 16/145,245

(22) Filed: Sep. 28, 2018

(65) Prior Publication Data

US 2019/0035550 A1 Jan. 31, 2019

Related U.S. Application Data

(63) Continuation of application No. PCT/JP2017/041738, filed on Nov. 21, 2017.

(30) Foreign Application Priority Data

Nov. 28, 2016 (JP) .............................. JP2016-229707

(51) Int. Cl.
*H01F 27/29* (2006.01)
*H01F 41/04* (2006.01)
(Continued)

(52) U.S. Cl.
CPC ....... *H01F 41/043* (2013.01); *H01F 17/0013* (2013.01); *H01F 27/2804* (2013.01);
(Continued)

(58) Field of Classification Search
CPC .................................................. H01F 17/0013
(Continued)

(56) References Cited

U.S. PATENT DOCUMENTS

| 2003/0134612 A1 | 7/2003 | Nakayama et al. |
| 2006/0022788 A1 | 2/2006 | Sasamori et al. |
| 2020/0090854 A1* | 3/2020 | Schumann ............. H05K 1/111 |

FOREIGN PATENT DOCUMENTS

| JP | 2-161709 A | 6/1990 |
| JP | 6-217482 A | 8/1994 |

(Continued)

OTHER PUBLICATIONS

Official Communication issued in International Patent Application No. PCT/JP2017/041738, dated Feb. 20, 2018.

*Primary Examiner* — Stanley Tso
(74) *Attorney, Agent, or Firm* — Keating & Bennett, LLP

(57) ABSTRACT

A multilayer substrate includes a lamination body including first and second resin substrates and a bonding layer that are hot-pressed. The first resin substrate includes a first surface provided with a first conductor pattern including a surface defined by a plated film, and a second surface provided with a second conductor pattern including a surface defined by a plated film. The second resin substrate includes a third surface provided with a third conductor pattern including a surface defined by a plated film, and a fourth surface provided with a fourth conductor pattern including a surface defined by a plated film. The first conductor pattern is located closer to a first outermost layer than the second conductor pattern. T1<T2 and T3<T4, where T1, T2, T3, and T4 respectively denote the thickness of the first, second, third, and fourth conductor patterns.

17 Claims, 11 Drawing Sheets

(51) Int. Cl.
*H05K 1/18* (2006.01)
*H01F 27/28* (2006.01)
*H05K 1/11* (2006.01)
*H05K 3/34* (2006.01)
*H01F 17/00* (2006.01)
*H05K 1/16* (2006.01)

(52) U.S. Cl.
CPC ............. *H01F 27/29* (2013.01); *H05K 1/111* (2013.01); *H05K 1/165* (2013.01); *H05K 1/181* (2013.01); *H05K 3/341* (2013.01); *H01F 2017/004* (2013.01); *H01F 2027/2809* (2013.01); *H05K 2201/1003* (2013.01)

(58) Field of Classification Search
USPC .......................................................... 336/200
See application file for complete search history.

(56) References Cited

FOREIGN PATENT DOCUMENTS

| | | | |
|---|---|---|---|
| JP | 2006-041418 | A | 2/2006 |
| JP | 2006-332147 | A | 12/2006 |
| JP | 2008-306007 | A | 12/2008 |
| JP | 2009-010268 | A | 1/2009 |
| WO | 01/067470 | A1 | 9/2001 |

\* cited by examiner

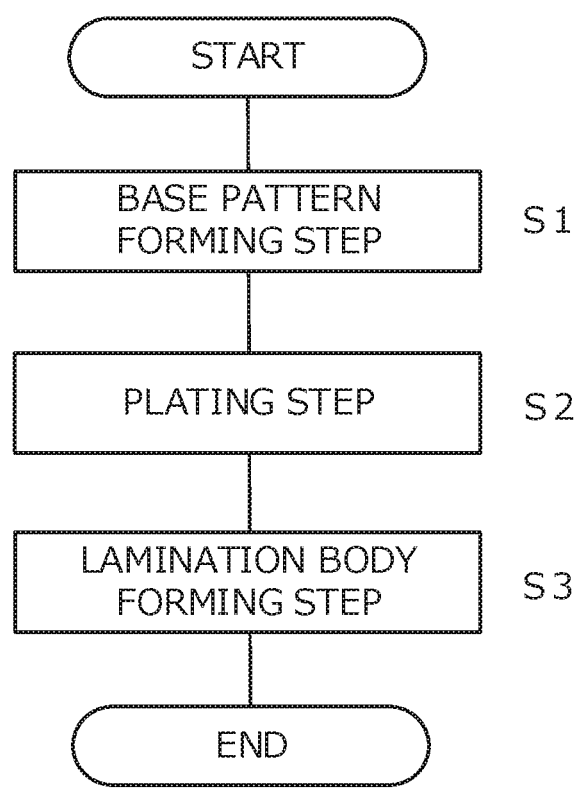

MULTILAYER SUBSTRATE, STRUCTURE OF MULTILAYER SUBSTRATE MOUNTED ON CIRCUIT BOARD, METHOD FOR MOUNTING MULTILAYER SUBSTRATE, AND METHOD FOR MANUFACTURING MULTILAYER SUBSTRATE

CROSS REFERENCE TO RELATED APPLICATIONS

This application claims the benefit of priority to Japanese Patent Application No. 2016-229707 filed on Nov. 28, 2016 and is a Continuation Application of PCT Application No. PCT/JP2017/041738 filed on Nov. 21, 2017. The entire contents of each application are hereby incorporated herein by reference.

BACKGROUND OF THE INVENTION

1. Field of the Invention

The present invention relates to a multilayer substrate including laminated and thermocompression-bonded substrates made of an insulating resin and including conductor patterns on both surfaces thereof, a structure of the multilayer substrate mounted on a circuit board, a method for mounting the multilayer substrate, and a method for manufacturing the multilayer substrate.

2. Description of the Related Art

Some existing multilayer substrates formed by laminating substrates having conductor patterns formed thereon together through hot pressing have the conductor patterns thickened by plating to form a coil having a high quality factor. Some other existing multilayer substrates include conductor patterns on both surfaces of the substrates to reduce the number of the laminated substrates of the multilayer substrates.

For example, Japanese Unexamined Patent Application Publication No. 2006-332147 describes a multilayer substrate including a coil portion formed by laminating insulating substrates having conductors formed on both surfaces thereof by plating deposition.

According to a method of thickening conductor patterns or narrowing the distance between adjacent conductor patterns by plating, as the plated films are thicker, the conductor patterns have a larger cross-sectional, and thus, the resistance of the conductor patterns per unit length is reduced. However, the growth rate (deposition rate) of the plated films varies depending on factors, such as the convection state of a plating solution in a plating bath, the electrode interval in the case of electroplating, and the difference in shape between the conductor patterns. Therefore, further thickening the plated films is more likely to increase the difference in film thickness to further vary the thickness or width of the conductor patterns. Thus, narrowing the distance between the centers of the adjacent conductor patterns (narrowing the pitch) to highly densely arrange the conductor patterns would be more likely to bring the conductor patterns into contact with each other and cause a short circuit.

An example of a method to prevent a problem, such as a short circuit, caused by the difference in thickness between the plated films is to adjust the conductor thickness by grinding a conductor pattern obtained after plating deposition. This method, however, additionally includes a grinding step, and fails to adjust the variation of the distance in the width direction (spacing) although it can make the thickness of the conductor pattern uniform. Thus, deformation of the laminated insulating substrates or conductor patterns with heat or pressure would cause a short circuit between the conductor patterns in the width direction.

SUMMARY OF THE INVENTION

Preferred embodiments of the present invention provide multilayer substrates that each prevent a short circuit between conductor patterns on which plated films are deposited, structures of multilayer substrates mounted on circuit boards, methods for mounting multilayer substrates, and methods for manufacturing multilayer substrates.

A multilayer substrate according to a preferred embodiment of the present invention includes a plurality of resin substrates, a bonding layer disposed between the resin substrates adjacent to each other in a lamination direction in which the plurality of resin substrates are laminated, and a plurality of conductor patterns provided on both surfaces of the plurality of resin substrates, and including a surface defined by a plated film. The plurality of resin substrates include a first resin substrate including a first surface and a second surface opposite to the first surface, and a second resin substrate including a third surface facing the second surface and a fourth surface opposite to the third surface. The plurality of conductor patterns include a first conductor pattern disposed on the first surface and including a surface defined by a plated film, a second conductor pattern disposed on the second surface and including a surface defined by a plated film, a third conductor pattern disposed on the third surface and including a surface defined by a plated film, and a fourth conductor pattern disposed on the fourth surface and including a surface defined by a plated film. The first conductor pattern is located closer to a first outermost layer than the second conductor pattern. T1<T2 and T3<T4, where T1 denotes a thickness of the first conductor pattern, T2 denotes a thickness of the second conductor pattern, T3 denotes a thickness of the third conductor pattern, and T4 denotes a thickness of the fourth conductor pattern.

In the above-described structure, the plated film of the first conductor pattern has a small variation in thickness, and thus the first conductor pattern has a small variation in spacing. The first surface of the first resin substrate receives the most heat and the highest pressure when the multilayer substrate is manufactured or mounted on a circuit board. As described above, since the first conductor pattern has a small spacing variation, an unintended short circuit of the first conductor pattern is prevented.

In the above-described structure, since the third conductor pattern includes the plated film having a small variation in thickness, an unintended interlayer short circuit between the second conductor pattern and the third conductor pattern is prevented.

The thickness T1 of the first conductor pattern is preferably smaller than the thickness T3 of the third conductor pattern. This structure more effectively prevents a first conductor pattern from causing a line-to-line short circuit without increasing an entire conductor loss of the conductor patterns.

The plurality of conductor patterns preferably include a thick conductor pattern and a thin conductor pattern, which are provided in accordance with surfaces on which the conductor patterns are disposed. Of the conductor patterns facing each other with the bonding layer interposed therebetween, the thick conductor pattern preferably faces the thin conductor pattern. In this structure, thick conductor patterns do not face each other in the lamination direction, and thus a short circuit in the lamination direction therebetween is prevented.

Preferably, the plurality of resin substrates include a third resin substrate including a fifth surface and a sixth surface opposite to the fifth surface, and a fourth resin substrate including a seventh surface facing the sixth surface and an eighth surface opposite to the seventh surface. The plurality of conductor patterns include a fifth conductor pattern disposed on the fifth surface and including a surface defined by a plated film, a sixth conductor pattern disposed on the sixth surface and including a surface defined by a plated film, a seventh conductor pattern disposed on the seventh surface and including a surface defined by a plated film, and an eighth conductor pattern disposed on the eighth surface and including a surface defined by a plated film. The fifth conductor pattern is located closer to a second outermost layer than the sixth conductor pattern is. The fifth conductor pattern, the sixth conductor pattern, the seventh conductor pattern, and the eighth conductor pattern including overlapping portions when viewed in the lamination direction and are arranged along each other. Preferably, $T5<T6$ and $T7<T8$, where $T5$ denotes a thickness of the fifth conductor pattern, $T6$ denotes a thickness of the sixth conductor pattern, $T7$ denotes a thickness of the seventh conductor pattern, and $T8$ denotes a thickness of the eighth conductor pattern.

In this structure, when the lamination body is hot-pressed at both surfaces thereof, line-to-line short circuits of the first conductor pattern and the fifth conductor pattern are prevented since the first conductor pattern and the fifth conductor pattern have relatively large spacing.

The conductor patterns provided on both surfaces of the plurality of resin substrates may be electrically connected with each other via interlayer connection conductors at a plurality of portions to be connected in parallel. In this structure, the conductor patterns of the different layers are connected in parallel at the plurality of portions. Thus, even when the conductor patterns include a thin portion, the entire conductor loss of the conductor patterns is reduced.

The multilayer substrate preferably also includes a terminal electrode disposed on a mount surface of a lamination body including the plurality of resin substrates and the bonding layer laminated together, the mount surface being located closer to the second resin substrate than to the first resin substrate. In this structure, the first conductor pattern is effectively prevented from causing a short circuit when a surface of the multilayer substrate close to the first resin substrate is heated and pressed to mount the multilayer substrate on a circuit board.

A structure of a multilayer substrate mounted on a circuit board includes a multilayer substrate according to a preferred embodiment of the present invention, and a circuit board on which the multilayer substrate is mounted. The terminal electrode is connected to a pad electrode disposed on the circuit board.

When the multilayer substrate is mounted on a circuit board, the surface of the multilayer, which is close to the first resin substrate, is heated with, for example, a hot bar. Since the first conductor pattern originally has relatively large spacing, a line-to-line short circuit of the first conductor pattern is prevented.

A method for mounting a multilayer substrate according to a preferred embodiment of the present invention is a method for mounting a multilayer substrate according to a preferred embodiment of the present invention on a circuit board, the method including heating with a hot bar a surface of the multilayer substrate opposite to a surface on which the terminal electrode is disposed to connect the terminal electrode to a pad electrode disposed on the circuit board.

According to the above-described method, the multilayer substrate is able to be mounted by simple method of heating with a hot bar a surface of the multilayer substrate opposite to the surface on which the terminal electrode is disposed. Furthermore, the above-described method prevents a line-to-line short circuit of the first conductor pattern, located closest to the hot bar.

A method for manufacturing a multilayer substrate according to a preferred embodiment of the present invention includes a base pattern forming step of forming base patterns on both surfaces of a plurality of resin substrates by patterning copper foil, each of the base patterns defining the same or substantially the same plane and having a uniform or substantially a uniform thickness, a plating step of growing a copper-plated film on the base patterns, and a lamination body forming step of laminating and thermocompression-bonding together the plurality of resin substrates with a bonding layer interposed therebetween to form a lamination body. The plurality of resin substrates include a first resin substrate including a first surface and a second surface opposite to the first surface, a second resin substrate including a third surface facing the second surface and a fourth surface opposite to the third surface, a third resin substrate including a fifth surface and a sixth surface opposite to the fifth surface, and a fourth resin substrate including a seventh surface facing the sixth surface and an eighth surface opposite to the seventh surface. The first surface is located closer to a first outermost layer of the lamination body than the second surface is, and the fifth surface is located closer to a second outermost layer of the lamination body than the sixth surface is. A first conductor pattern, disposed on the first surface and including a corresponding one of the base patterns and a corresponding one of the plated films, a second conductor pattern, disposed on the second surface and including a corresponding one of the base patterns and a corresponding one of the plated films, a third conductor pattern, disposed on the third surface and including a corresponding one of the base patterns and a corresponding one of the plated films, and a fourth conductor pattern disposed on the fourth surface and including a corresponding one of the base patterns and a corresponding one of the plated films, include overlapping portions when viewed in a lamination direction and are arranged along each other. A fifth conductor pattern, disposed on the fifth surface and including a corresponding one of the base patterns and a corresponding one of the plated films, a sixth conductor pattern, disposed on the sixth surface and including a corresponding one of the base patterns and a corresponding one of the plated films, a seventh conductor pattern, disposed on the seventh surface and including a corresponding one of the base patterns and a corresponding one of the plated films, and an eighth conductor pattern, disposed on the eighth surface and including a corresponding one of the base patterns and a corresponding one of the plated films, include overlapping portions when viewed in the lamination direction and are arranged along each other. $T1<T2$, $T3<T4$, $T5<T6$, and $T7<T8$, where $T1$ denotes a thickness of the first conductor pattern, $T2$ denotes a thickness of the second conductor pattern, $T3$ denotes a thickness of the third conductor pattern, $T4$ denotes a thickness of the fourth conductor pattern, $T5$ denotes a thickness of the fifth conductor pattern, $T6$ denotes a thickness of the sixth conductor pattern, $T7$ denotes a thickness of the seventh conductor pattern, and T8 denotes a thickness of the eighth conductor pattern.

The above-described manufacturing method is able to achieve a multilayer substrate that prevents line-to-line short circuits of the first conductor pattern and the fifth conductor pattern when the lamination body is hot-pressed at both surfaces thereof, since the first conductor pattern and the fifth conductor pattern have relatively large spacing.

Preferred embodiments of the present invention are able to achieve multilayer substrates that prevent a short circuit between conductor patterns each including a plated film, and structures of multilayer substrates mounted on circuit boards.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a flowchart of a process for manufacturing a multilayer substrate according to a preferred embodiment of the present invention.

DETAILED DESCRIPTION OF THE PREFERRED EMBODIMENTS

A plurality of preferred embodiments of the present invention are described below with reference to the drawings. Throughout the drawings, the same components are denoted with the same reference signs. For the purposes of illustration of main points or for ease of understanding, preferred embodiments are separately described. However, some components described in different preferred embodiments may be replaced with others or combined together. The second preferred embodiment and the following preferred embodiments are described on only the points different from those of the first preferred embodiment and not on the same points. Particularly, the same or similar advantageous effects obtained in the same structures are not described in every preferred embodiment.

First Preferred Embodiment

Figure 1:
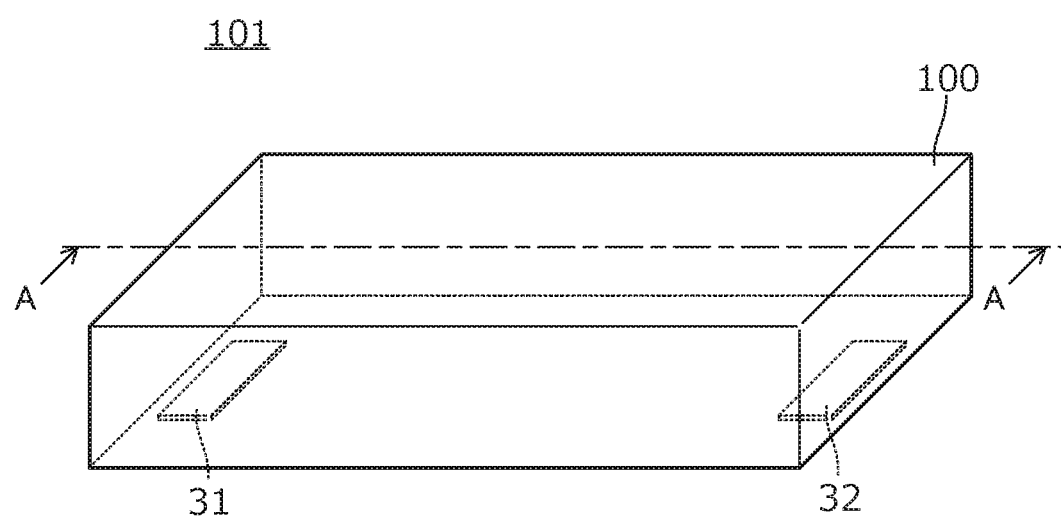
FIG. 1 is a perspective view of a multilayer substrate according to a first preferred embodiment of the present invention.

FIG. 1 is a perspective view of a multilayer substrate 101 according to a first preferred embodiment of the present invention. The multilayer substrate 101 includes a lamination body 100, including a plurality of resin substrates and a bonding layer disposed between the resin substrates adjacent to each other in a lamination direction of the plurality of resin substrates. Surface-mount terminal electrodes 31 and 32 are disposed on the undersurface of the multilayer substrate 101 in the direction illustrated in FIG. 1.

Figure 2A:
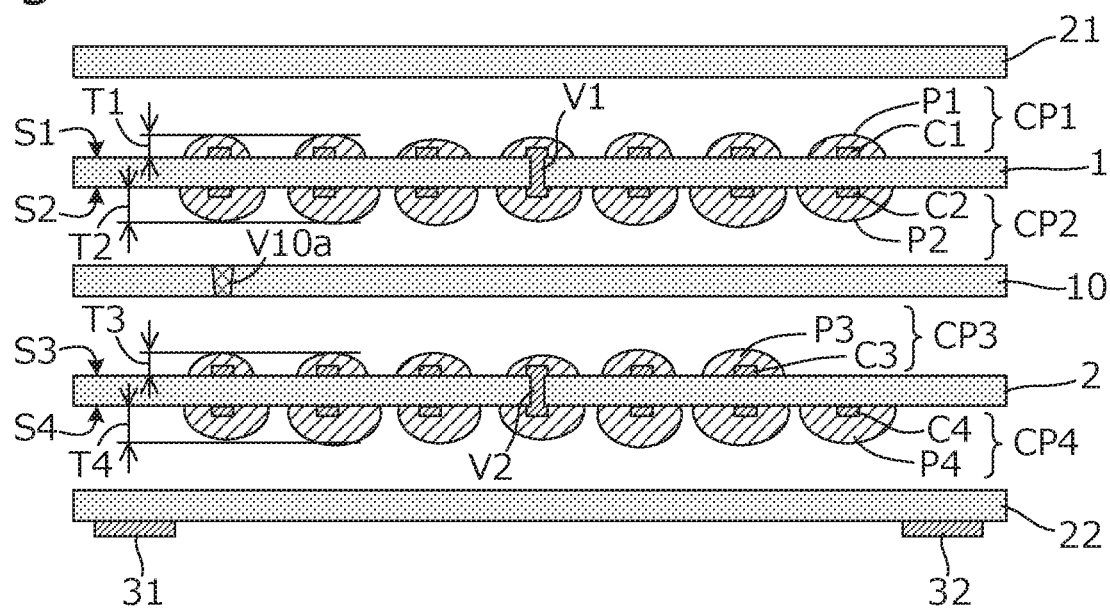
FIG. 2A is a sectional view of a plurality of resin substrates and a bonding layer of the multilayer substrate, before being laminated together.
Figure 2B:
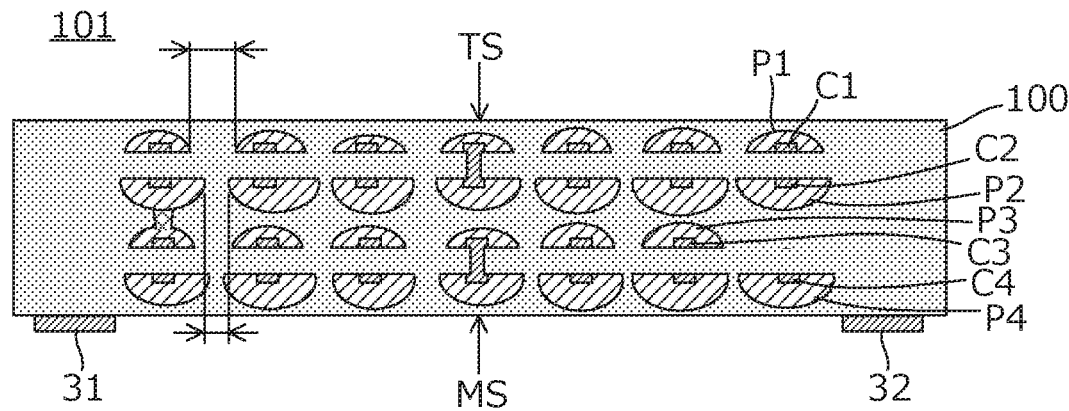
FIG. 2B is a sectional view of the multilayer substrate taken along line A-A in FIG. 1.
Figure 3:
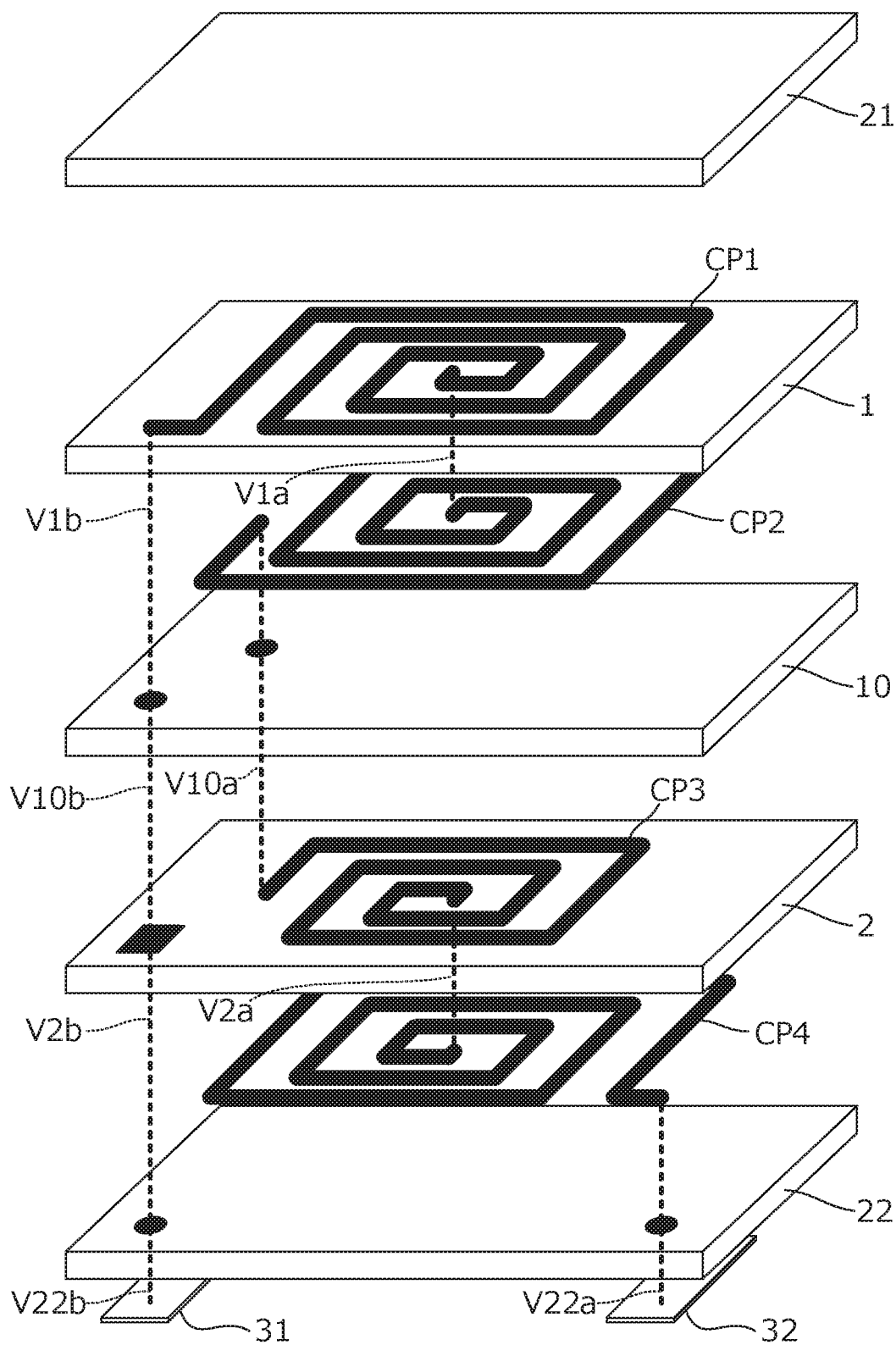
FIG. 3 is an exploded perspective view of the multilayer substrate shown in FIG. 1.

FIG. 2A is a sectional view of the plurality of resin substrates and the bonding layer of the multilayer substrate 101, before being laminated together. FIG. 2B is a sectional view of the multilayer substrate 101 taken along line A-A in FIG. 1. FIG. 3 is an exploded sectional view of the multilayer substrate 101.

The multilayer substrate 101 includes resin substrates 1 and 2, a bonding layer 10, and resin substrates 21 and 22. Here, the resin substrate 1 corresponds to a "first resin substrate", and the resin substrate 2 corresponds to a "second resin substrate". A first conductor pattern CP1 is disposed on a first surface S1 of the first resin substrate 1, and a second conductor pattern CP2 is disposed on a second surface S2 of the first resin substrate 1. A third conductor pattern CP3 is disposed on a third surface S3 of the second resin substrate 2, and a fourth conductor pattern CP4 is disposed on a fourth surface S4 of the second resin substrate 2.

The first conductor pattern CP1 includes a base conductor pattern C1 and a plated film P1 disposed on the surface of the base conductor pattern C1. The second conductor pattern CP2 includes a base conductor pattern C2 and a plated film P2 disposed on the surface of the base conductor pattern C2. Similarly, the third conductor pattern CP3 includes a base conductor pattern C3 and a plated film P3 disposed on the surface of the base conductor pattern C3. The fourth conductor pattern CP4 includes a base conductor pattern C4 and a plated film P4 disposed on the surface of the base conductor pattern C4. These conductor patterns CP1, CP2, CP3, and CP4 define a single or a plurality of coil conductor patterns.

The base conductor patterns C1, C2, C3, and C4 are preferably provided by patterning, for example, copper foil. The plated films P1, P2, P3, and P4 are preferably, for example, copper-plated films. These plated films P1, P2, P3, and P4 are thicker than the base conductor patterns C1, C2, C3, and C4.

The first conductor pattern CP1 is located closer to one of the outermost layers (upper surface in FIG. 2A) than the second conductor pattern CP2 is. In this example, the second conductor pattern CP2 and the third conductor pattern CP3 at least partially overlap each other in a plan view.

Here, preferably $T1<T2$ and $T3<T4$, for example, where T1 denotes the thickness of the first conductor pattern CP1, T2 denotes the thickness of the second conductor pattern CP2, T3 denotes the thickness of the third conductor pattern CP3, and T4 denotes the thickness of the fourth conductor pattern CP4. The present preferred embodiment also preferably satisfies the relationship of T1<T3, for example.

The present preferred embodiment also preferably satisfies the relationship of T2>T3, for example. Specifically, a plurality of conductor patterns include a thick conductor pattern and a thin conductor pattern provided in accordance with the surfaces on which they are provided. Of the conductor patterns facing each other with the bonding layer 10 interposed therebetween, the second conductor pattern CP2, which is a thick conductor pattern, faces the third conductor pattern CP3, which is a thin conductor pattern.

The above conductor patterns have different thicknesses, and thus T1, T2, T3, and T4 are statistical representative values, such as mean values (arithmetic mean values, geometrical mean values, or harmonic mean values), modes, or the medians.

An interlayer connection conductor V1, which connects the first conductor pattern CP1 and the second conductor pattern CP2 to each other, is located at a predetermined position of the first resin substrate 1. Similarly, an interlayer connection conductor V2, which connects the third conductor pattern CP3 and the fourth conductor pattern CP4 to each other, is located at a predetermined position of the second resin substrate 2. An interlayer connection conductor V10a is located at a predetermined position of the bonding layer 10.

The resin substrates 21 and 22, the bonding layer 10, the first resin substrate 1, and the second resin substrate 2 are thermoplastic resin sheets made of preferably, for example, a liquid crystal polymer.

As illustrated in FIG. 2A, the bonding layer 10 is disposed between the first resin substrate 1 including the first conductor pattern CP1 and the second conductor pattern CP2 provided thereon and the second resin substrate 2 including the third conductor pattern CP3 and the fourth conductor pattern CP4 provided thereon. The resin substrate 21 is disposed on the outer layer side of the first resin substrate 1, and the resin substrate 22 is disposed on the outer layer side of the second resin substrate 2.

The layers are laminated and hot-pressed at a predetermined temperature and a predetermined pressure to provide a lamination body 100, as illustrated in FIG. 2B. The bonding layer 10 is filled between the first resin substrate 1 and the second resin substrate 2, the resin substrate 21 is filled on a surface (upper surface) of the first resin substrate 1, and the resin substrate 22 is filled on a surface (lower surface) of the second resin substrate 2.

Resist films may be disposed on the surfaces (upper and lower surfaces) of the lamination body 100 as required.

FIG. 3 illustrates the second conductor pattern CP2 separated from the lower surface of the first resin substrate 1. Similarly, FIG. 3 illustrates the fourth conductor pattern CP4 separated from the lower surface of the second resin substrate 2.

Interlayer connection conductors V1a and V1b are disposed in the first resin substrate 1. Interlayer connection conductors V2a and V2b are disposed in the second resin substrate 2. Interlayer connection conductors V10a and V10b are disposed in the bonding layer 10. Interlayer connection conductors V22a and V22b are disposed in the resin substrate 22.

The first conductor pattern CP1, the second conductor pattern CP2, the third conductor pattern CP3, and the fourth conductor pattern CP4 are preferably coil conductor patterns that have a rectangular or substantially rectangular spiral shape, for example. The inner terminal of the first conductor pattern CP1 and the inner terminal of the second conductor pattern CP2 are connected together with the interlayer connection conductor V1a. The outer terminal of the second conductor pattern CP2 and the outer terminal of the third conductor pattern CP3 are connected together with the interlayer connection conductor V10a. The inner terminal of the third conductor pattern CP3 and the inner terminal of the fourth conductor pattern CP4 are connected together with the interlayer connection conductor V2a. The outer terminal of the fourth conductor pattern CP4 and the terminal electrode 32 are connected together with the interlayer connection conductor V22a. The outer terminal of the first conductor pattern CP1 and the terminal electrode 31 are connected together with interlayer connection conductors V1b, V10b, V2b, and V22b.

The terminal electrodes 31 and 32 are located at positions at which they do not overlap the coil conductor patterns in a plan view.

FIG. 4 is a flowchart of a non-limiting example of a method of manufacturing the multilayer substrate 101 according to the present preferred embodiment. As will be described below, the multilayer substrate 101 is preferably manufactured by being processed in a base pattern forming step S1, a plating step S2, and a lamination body forming step S3 in this order.

Base Pattern Forming Step

Base patterns are formed by photolithography on the first resin substrate 1 including copper foil attached to both surfaces thereof. Holes are formed at positions at which the interlayer connection conductors V1 and V2 illustrated in FIG. 2A are to be formed. The copper foil is formed into the base patterns. Thus, each base pattern is located in the same or substantially the same plane and has a uniform or substantially uniform thickness.

Plating Step

Copper plated films are deposited on the base patterns by electroplating. In the plating step S2, the plating bath time period is controlled to form each conductor pattern having a predetermined plating thickness. For example, firstly, a resist film is formed on the first surface S1 of the first resin substrate 1, and the first resin substrate 1 in this state is bathed in the plating bath for a first predetermined time period. Thus, a plated film having a predetermined thickness is formed on the second surface S2 of the first resin substrate 1. Subsequently, the resist film is removed and the first resin substrate 1 is bathed in the plating bath for a second predetermined time period. Thus, a plated film P1 having a thickness corresponding to the second predetermined time period is formed on the first surface S1 of the first resin substrate 1, and a plated film P2 having a thickness corresponding to the sum of the first predetermined time period and the second predetermined time period is formed on the second surface S2 of the first resin substrate 1. Similarly, plated films P3 and P4 having different thickness are formed on the second resin substrate 2.

In the plating step S2, plated films are formed in the holes at which the interlayer connection conductors V1 and V2 are to be formed, so that the interlayer connection conductors V1 and V2 are formed.

Another example of plating other than the one described above is to bathe the resin substrate in the plating bath to form plated films of a predetermined thickness on both surfaces thereof, dispose a resist film on the surface that is to have a thin plated film, and further grow the plated film on the surface having no resist film disposed thereon. Another example is to dispose a resist film on a first surface, form a plated film of a predetermined thickness on a second surface, remove the resist film on the first surface, form a resist film on the second surface, and form a plated film of a predetermined thickness on the first surface.

Lamination Body Forming Step

As illustrated in FIG. 2A, the resin substrate 22, the second resin substrate 2, the bonding layer 10, the first resin substrate 1, and the resin substrate 21 are laminated in this order and hot-pressed at a predetermined temperature and a predetermined pressure. For example, preferably, they are pressed at a temperature within the range of about 280° C. to about 320° C., for example. Thus, the lamination body 100 illustrated in FIG. 2B is formed.

As in the present preferred embodiment, when the interlayer connection conductor V10a is formed in the bonding layer 10, it is formed before the lamination body forming step S3. For example, preferably a hole is formed at a predetermined position of the bonding layer 10, a protection sheet is bonded to one surface of the bonding layer 10, the hole is filled with an electroconductive paste, and the protection sheet is removed. Thus, the bonding layer 10 including the electroconductive paste disposed in the hole is formed. In the lamination body forming step, the electroconductive paste is solidified into an interlayer connection conductor.

The present preferred embodiment achieves the following advantageous effects.

The first surface of the first resin substrate receives the most heat and the highest pressure when the multilayer substrate is manufactured or mounted on a circuit board. Since the first conductor pattern includes the plated film having a small variation in thickness, the first conductor pattern also has a small spacing variation, and an unintended short circuit of the first conductor pattern is prevented.

The third conductor pattern CP3 is relatively thin. Thus, the plated film of the third conductor pattern CP3 has a small variation in thickness. The interlayer distance between the second conductor pattern CP2 and the third conductor pattern CP3 thus increases, and an interlayer short circuit between the second conductor pattern CP2 and the third conductor pattern CP3 is prevented.

The thickness T1 of the first conductor pattern is smaller than the thickness T3 of the third conductor pattern. Thus, a line-to-line short circuit of the first conductor pattern CP1 is more effectively prevented without increasing an entire conductor loss of the conductor patterns.

A thick conductor pattern and a thin conductor pattern face each other with a bonding layer interposed therebetween. Thus, thick conductor patterns do not face each other in the lamination direction, and a short circuit in the lamination direction is prevented.

The interlayer connection conductor thermally connects the first conductor pattern to a conductor pattern on a layer that is located farther inward than the first conductor pattern. Thus, thermal conduction from the first conductor pattern to the inner layers is facilitated, the temperature distribution between the outer layers and the inner layers of the lamination body is reduced, and the entirety thereof is laminated and compression-bonded together while a resin flow near the outer layer is reduced or prevented. Furthermore, the multilayer substrate is able to be quickly mounted on a circuit board. Particularly, when the conductor patterns are coil conductor patterns, interlayer connection conductors are provided, and a heat conduction effect with the interlayer connection conductors is high.

Second Preferred Embodiment

Figure 5A:
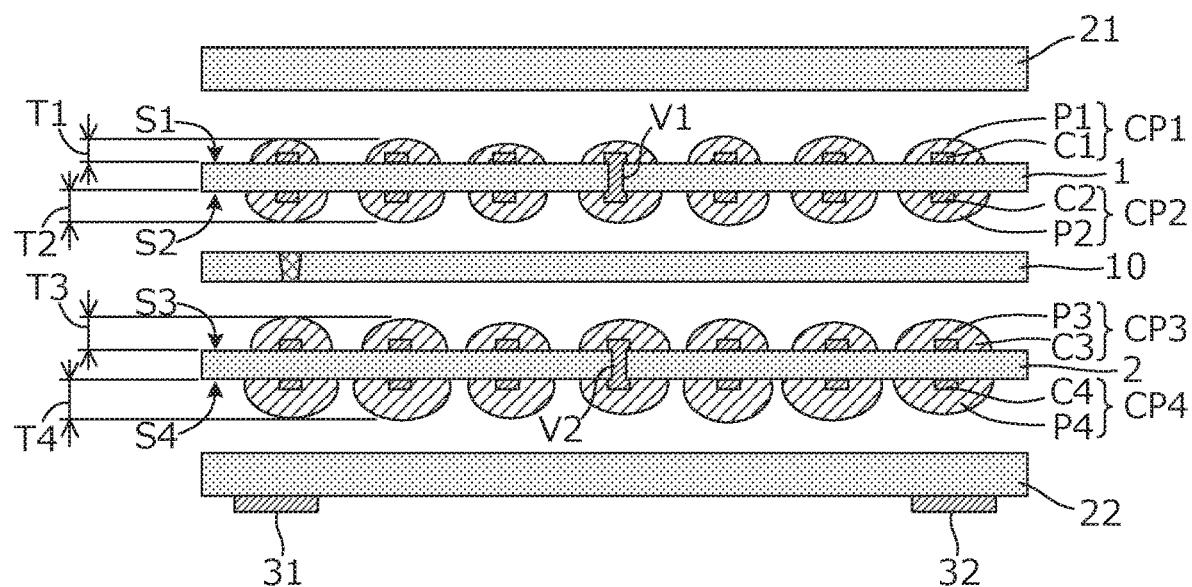
FIG. 5A is a sectional view of a plurality of resin substrates and a bonding layer of a multilayer substrate according to a second preferred embodiment of the present invention, before being laminated together.
Figure 5B:
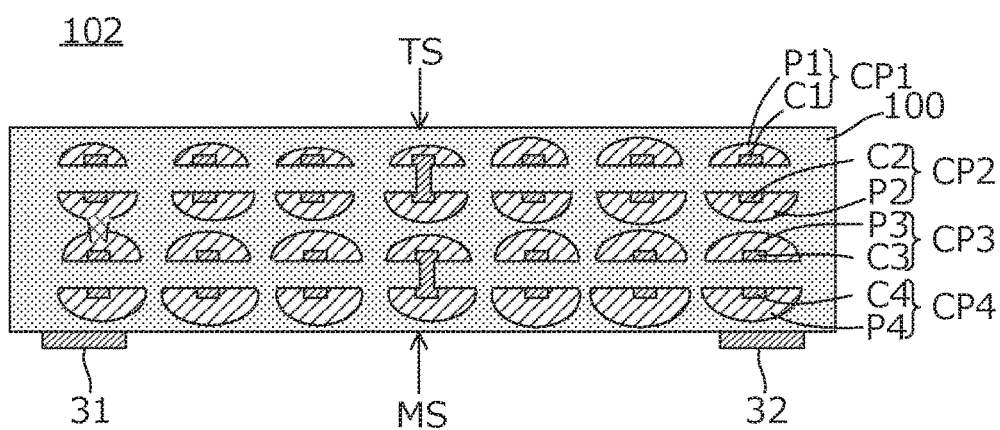
FIG. 5B is a sectional view of the multilayer substrate.

FIG. 5A is a sectional view of a plurality of resin substrates and a bonding layer of a multilayer substrate 102 according to a second preferred embodiment of the present invention, before being laminated together, and FIG. 5B is a sectional view of the multilayer substrate 102. The multilayer substrate 102 is different from the multilayer substrate 101 according to the first preferred embodiment in terms of the thickness of the third conductor pattern.

Here, preferably T1<T2 and T3<T4, for example, where T1 denotes the thickness of the first conductor pattern CP1, T2 denotes the thickness of the second conductor pattern CP2, T3 denotes the thickness of the third conductor pattern CP3, and T4 denotes the thickness of the fourth conductor pattern CP4. The present preferred embodiment also preferably satisfies the relationship T1<T3, and the relationship T2<T3.

As described in the present preferred embodiment, the second conductor pattern CP2 may be thinner than the third conductor pattern CP3. Alternatively, the third conductor pattern CP3 may be thinned so as to satisfy the relationship T1>T3.

Third Preferred Embodiment

Figure 6:
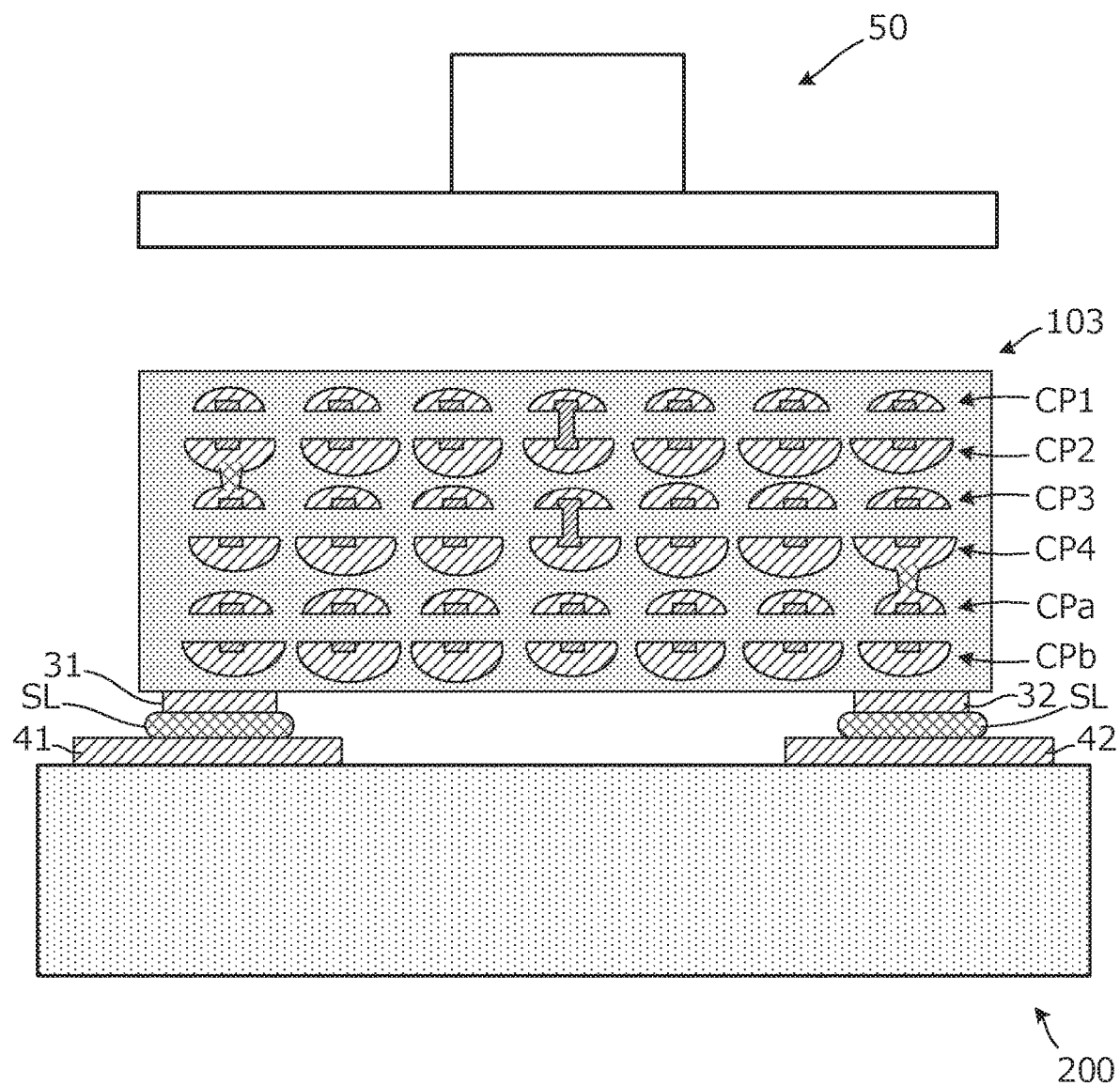
FIG. 6 illustrates a structure of a multilayer substrate according to a third preferred embodiment of the present invention mounted on a circuit board and a method for mounting the multilayer substrate.

FIG. 6 illustrates a structure of a multilayer substrate 103 according to a third preferred embodiment of the present invention mounted on a circuit board and a method for mounting the multilayer substrate.

The multilayer substrate 103 includes six conductor patterns CP1, CP2, CP3, CP4, CPa, and CPb. Other basic components are the same or substantially the same as those of the multilayer substrates according to the first and second preferred embodiments.

Pad electrodes 41 and 42 are disposed on a circuit board 200 and include solder paste SL printed on their surfaces. The multilayer substrate 103 is mounted on the circuit board 200 with the terminal electrodes 31 and 32 respectively facing the pad electrodes 41 and 42. A surface of the multilayer substrate 103 opposite to a surface on which the terminal electrodes 31 and 32 are disposed is heated and pressed with a hot bar 50. The terminal electrodes 31 and 32 are then soldered to the pad electrodes 41 and 42.

In the present preferred embodiment, preferably T1<T2 and T3<T4, for example, where T1, T2, T3, and T4 respectively denote the thickness of the conductor patterns CP1, CP2, CP3, and CP4.

In this manner, preferably, the hot bar 50 is brought into contact with the outer surface of the outermost layer located closer to the first conductor pattern CP1 that includes a relatively thin plated film. The plated film of the first conductor pattern CP1 has a small variation in thickness, so that the first conductor pattern CP1 has a small spacing variation. The first conductor pattern CP1 receives the most heat and the highest pressure in mounting. However, the first conductor pattern CP1 has a small spacing variation as described above, and thus an unintended short circuit of the first conductor pattern CP1 is prevented.

For the above-described reason, preferably, the plated film of the first conductor pattern CP1 among the multiple conductor patterns is the thinnest.

In the example illustrated in FIG. 6, preferably Ta<Tb, for example, where Ta and Tb respectively denote the thickness of conductor patterns CPa and CPb. Therefore, thick plated films do not face each other, and the variation in interlayer distance is reduced. Thus, an unintended interlayer short circuit is able to be reduced.

Alternatively, the structure may satisfy Ta>Tb. Even in this structure, heat from the hot bar 50 is less easily transferred to the positions at which the conductor patterns CPa and CPb are provided. Thus, the bonding layer between the fourth conductor pattern CP4 and the conductor pattern CPa flows to a lesser extent. This prevents an interlayer short circuit between the fourth conductor pattern CP4 and the conductor pattern CPa.

Fourth Preferred Embodiment

Figure 7:
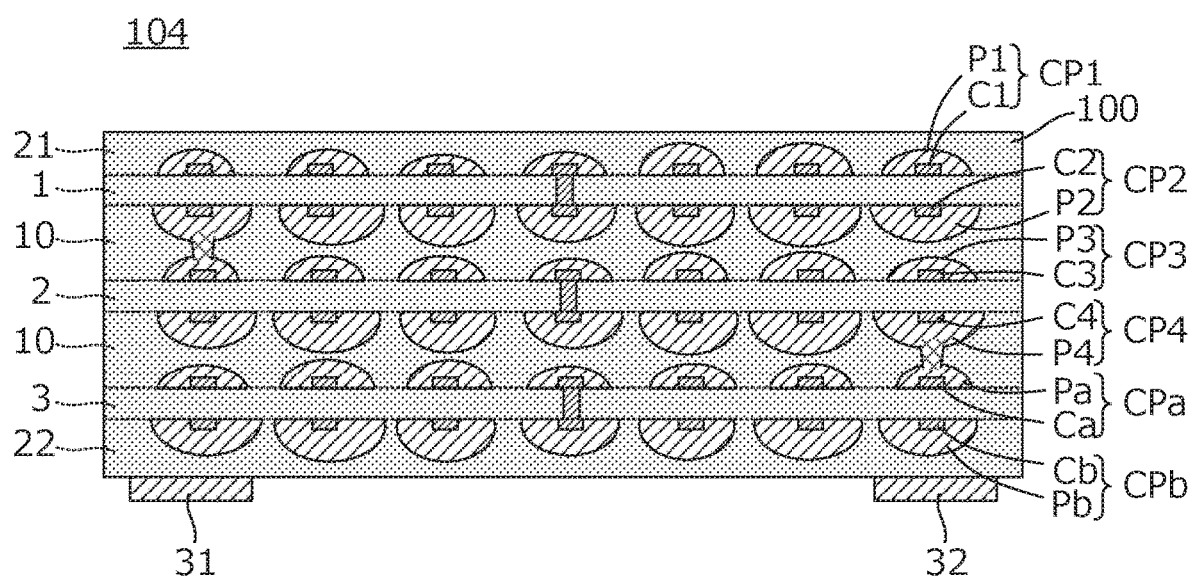
FIG. 7 is a sectional view of a multilayer substrate according to a fourth preferred embodiment of the present invention.

FIG. 7 is a sectional view of a multilayer substrate 104 according to a fourth preferred embodiment of the present invention. The multilayer substrate 104 includes three resin substrates 1, 2, and 3, each including conductor patterns on both surfaces thereof.

A plurality of conductor patterns include a thick conductor pattern and a thin conductor pattern provided in accordance with the surfaces on which the conductor patterns are disposed. Facing ones of the plurality of conductor patterns with the bonding layer 10 interposed therebetween include overlapping portions in a plan view, and define a pair of a thin conductor pattern and a thick conductor pattern or a pair of thin conductor patterns.

As illustrated in FIG. 7, the first conductor pattern CP1 is thinner than the second conductor pattern CP2, and the third conductor pattern CP3 is thinner than the fourth conductor pattern CP4. The conductor pattern CPa is thinner than the conductor pattern CPb. Thus, the second conductor pattern CP2 and the third conductor pattern CP3 facing each other with the bonding layer 10 interposed therebetween define a pair of a thick conductor pattern and a thin conductor pattern. Similarly, the fourth conductor pattern CP4 and the conductor pattern CPa facing each other with the bonding layer 10 interposed therebetween define a pair of a thick conductor pattern and a thin conductor pattern.

In this structure, thick conductor patterns do not face each other in the lamination direction, and a short circuit therebetween is prevented.

Fifth Preferred Embodiment

Figure 8:
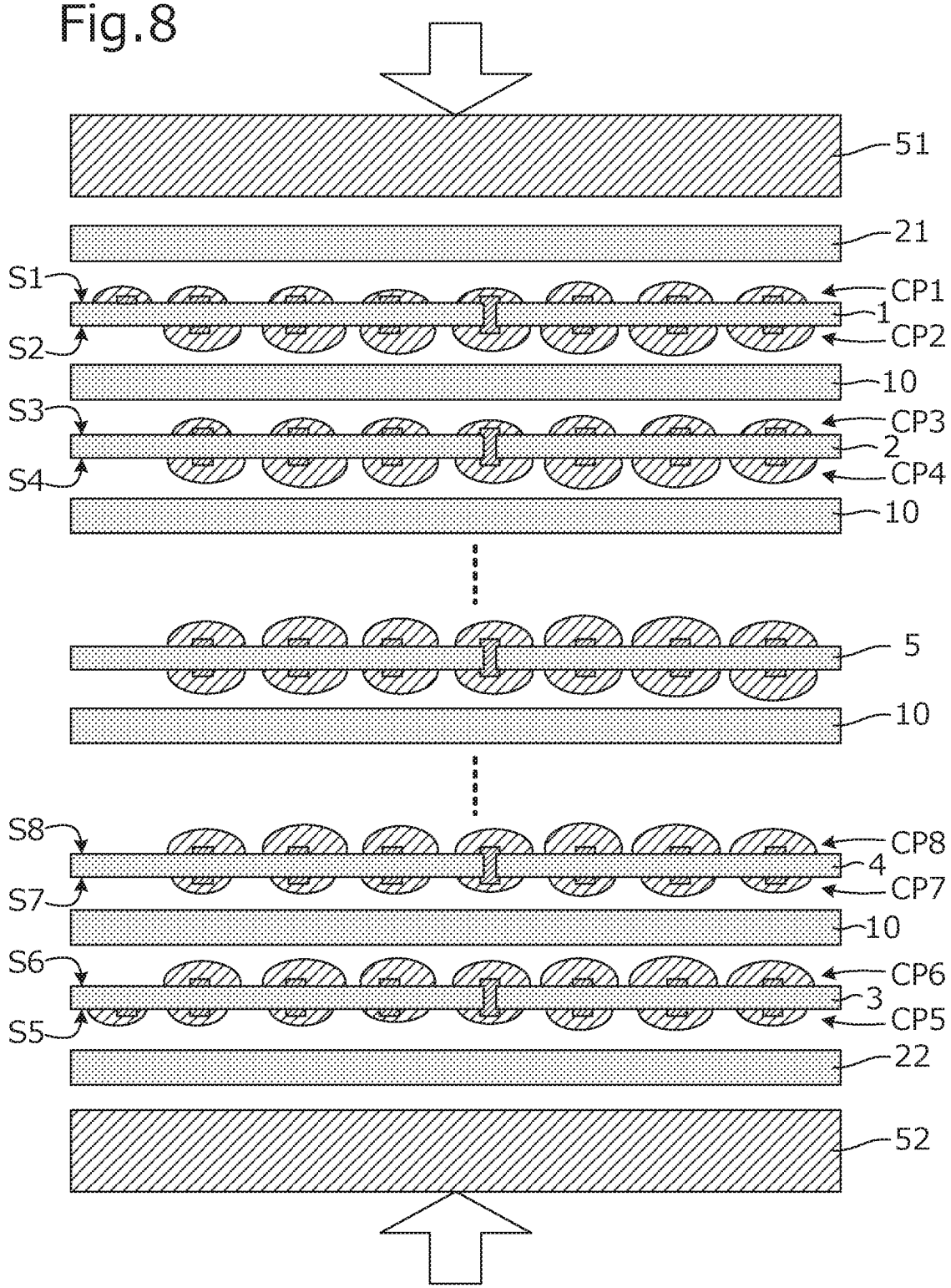
FIG. 8 is a sectional view of a multilayer substrate according to a fifth preferred embodiment of the present invention before undergoing lamination.

FIG. 8 is a sectional view of a multilayer substrate according to a fifth preferred embodiment of the present invention, before undergoing lamination. The multilayer substrate includes a first resin substrate 1, a second resin substrate 2, a third resin substrate 3, a fourth resin substrate 4, another resin substrate 5, a plurality of bonding layers 10, and resin substrates 21 and 22.

These layers are laminated together, and disposed between hot-press plates 51 and 52 to be hot-pressed at a predetermined temperature and a predetermined pressure.

The first conductor pattern CP1, the second conductor pattern CP2, the third conductor pattern CP3, and the fourth conductor pattern CP4 include overlapping portions when viewed in the lamination direction and are arranged along each other. The fifth conductor pattern CP5, the sixth conductor pattern CP6, the seventh conductor pattern CP7, and the eighth conductor pattern CP8 include overlapping portions when viewed in the lamination direction and are arranged along each other.

Here, preferably T1<T2, T3<T4, T5<T6, and T7<T8, for example, where T1, T2, T3, T4, T5, T6, T7, and T8 respectively denote the thickness of the conductor patterns CP1, CP2, CP3, CP4, CP5, CP6, CP7, and CP8.

When the lamination body is hot-pressed at both surfaces thereof, the portion of the lamination body located closer to the hot-press plates 51 and 52 (portions closer to the surfaces near the outermost layers) receive more heat and higher pressure than intermediate layers. In the present preferred embodiment, the first conductor pattern CP1 located closer to the surface near a first outermost layer is thinner than the second conductor pattern CP2 located on a layer located farther inward than the first conductor pattern CP1, and the fifth conductor pattern CP5 located closer to the surface near a second outermost layer is thinner than the sixth conductor pattern CP6 located on a layer located farther inward than the fifth conductor pattern CP5. Here, a pair of thick conductor patterns may face each other in the lamination direction with a bonding layer interposed therebetween, but the pair is preferably located at an intermediate layer (a layer near the center) in the lamination body. This is because heat from the hot-press plates 51 and 52 is less easily transferred to this position, a bonding layer between the conductor patterns flows to a lesser extent at the position, and thus an interlayer short circuit is less easily to occur.

In the above-described structure, the first conductor pattern CP1 and the fifth conductor pattern CP5 have relatively large spacing. Thus, line-to-line short circuits thereof are prevented.

Sixth Preferred Embodiment

Figure 9:
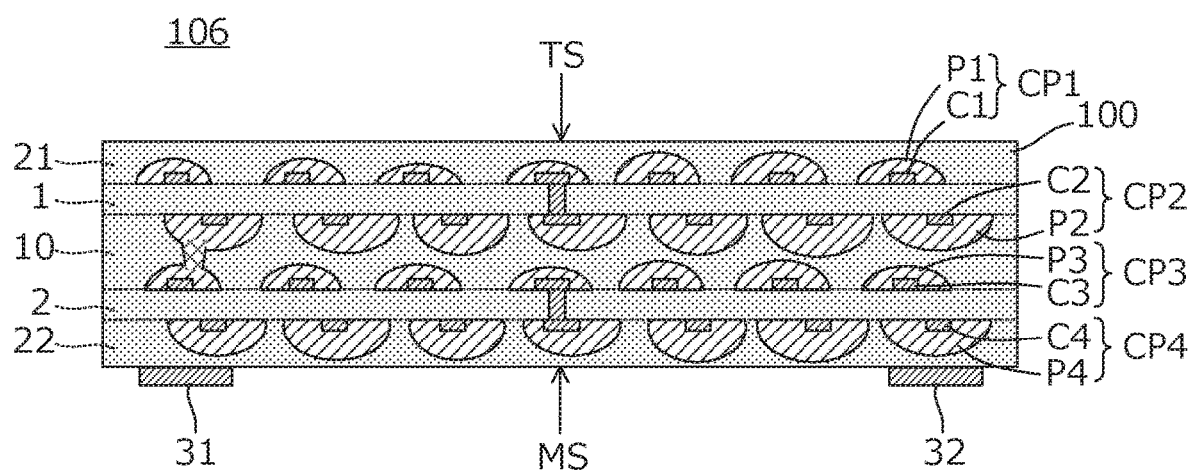
FIG. 9 is a sectional view of a multilayer substrate according to a sixth preferred embodiment of the present invention before undergoing lamination.

FIG. 9 is a sectional view of a multilayer substrate 106 according to a sixth preferred embodiment of the present invention before undergoing lamination. The multilayer substrate 106 includes a first resin substrate 1, a second resin substrate 2, a bonding layer 10, and resin substrates 21 and 22.

The multilayer substrate 106 differs from the multilayer substrate 101 according to the first preferred embodiment in the positions of the conductor patterns CP1, CP2, CP3, and CP4. The other components of the multilayer substrate 106 are the same or substantially the same as those of the multilayer substrate 101 according to the first preferred embodiment.

In the multilayer substrate 106, the first conductor pattern CP1, the second conductor pattern CP2, the third conductor pattern CP3, and the fourth conductor pattern CP4 are arranged at a constant pitch in the section taken in the lamination direction. The second conductor pattern CP2 is displaced from the third conductor pattern CP3 in the pitch direction. Specifically, the thickest portion (apex portion) of the second conductor pattern CP2 and the thickest portion (apex portion) of the third conductor pattern CP3 do not overlap in a plan view. In other words, the second conductor pattern CP2 having a rectangular or substantially rectangular spiral shape and the third conductor pattern CP3 having a rectangular or substantially rectangular spiral shape negligibly overlap each other in a plan view in the directions in which they are coiled. For example, the amount of the overlapped portion is preferably, for example, smaller than or equal to about 10%.

In this structure, the thickest portions of the second conductor pattern CP2 and the third conductor pattern CP3 are spaced apart from each other and face each other in a direction inclined from the lamination direction (in an oblique direction). Thus, a short circuit between the second conductor pattern CP2 and the third conductor pattern CP3 is prevented even when the second surface S2 and the third surface S3 are spaced a smaller distance apart.

Seventh Preferred Embodiment

Figure 10:
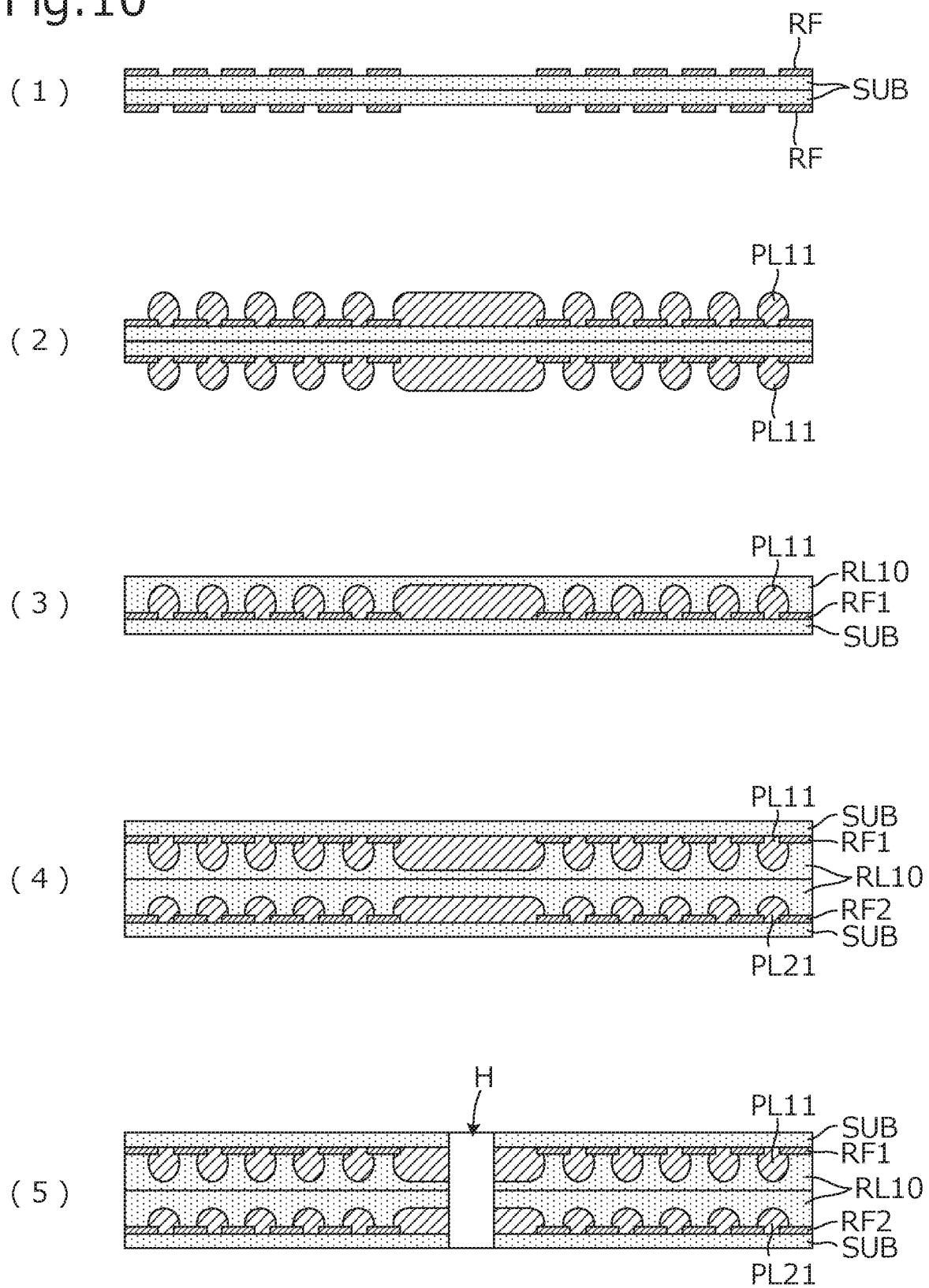
FIG. 10 illustrates the sequence of the procedure in the method for manufacturing a multilayer substrate according to a seventh preferred embodiment of the present invention.
Figure 11:
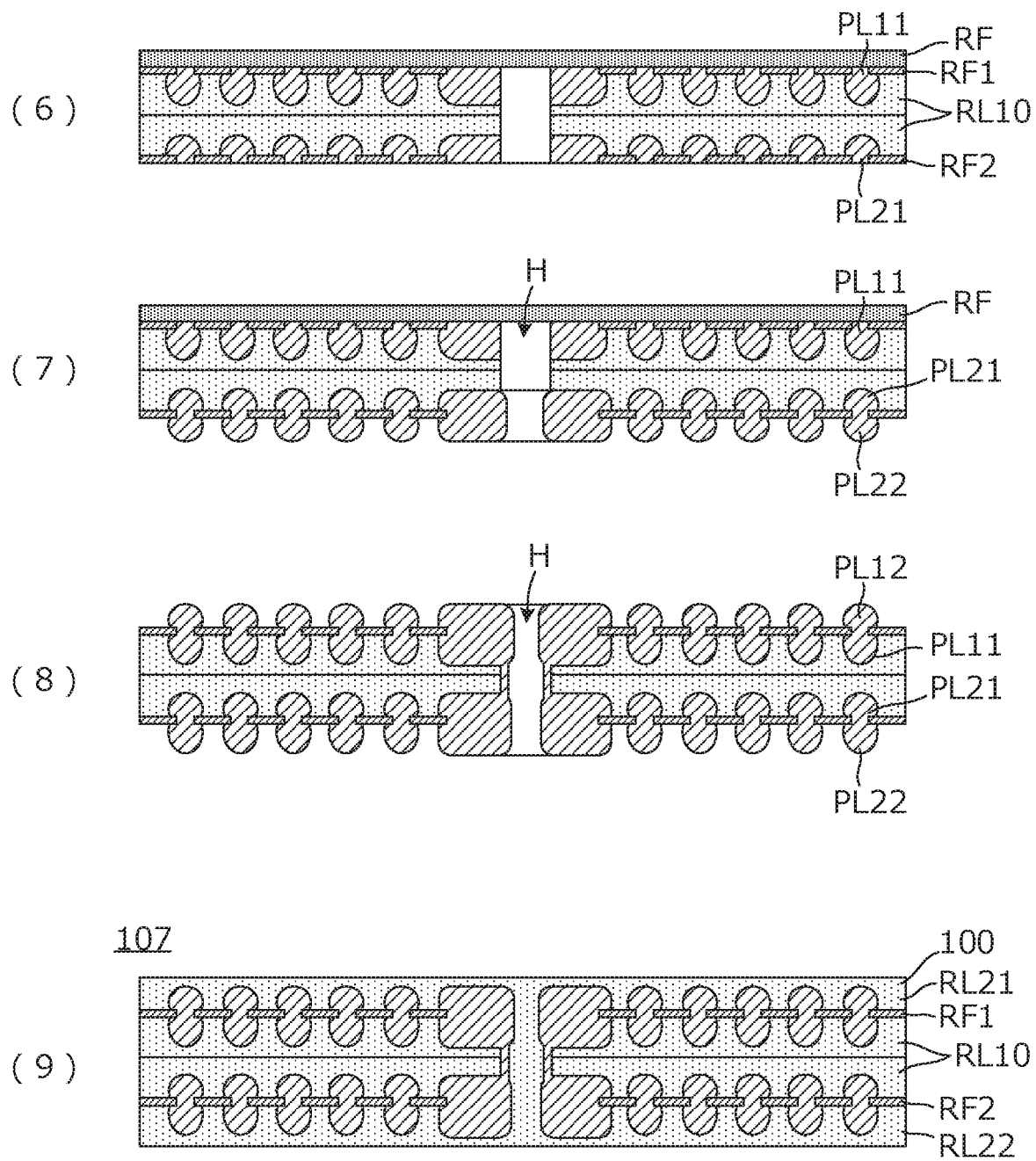
FIG. 11 illustrates the sequence of the procedure in a method for manufacturing the multilayer substrate according to the seventh preferred embodiment of the present invention, following the sequence illustrated in FIG. 10.

FIGS. 10 and 11 illustrate a method for manufacturing a multilayer substrate 107 according to a seventh preferred embodiment in order of the steps. The manufacturing method is as follows.

Firstly, photosensitive photoresist films RF1 are applied to the surfaces of substrates SUB including, for example, copper foil to define a base layer. Patterns on both surfaces of the substrates SUB are concurrently formed by welding the surrounding portions thereof with ultrasonic waves or by bonding them with an adhesive.

The photosensitive photoresists are then exposed to ultraviolet rays through photomasks. A laser drawing machine may directly irradiate the resists with ultraviolet rays to draw fine patterns. Subsequently, the resist films RF1 on the surfaces of the substrates SUB are developed into patterns.

Subsequently, plated films PL11 are deposited in the openings of the resist films RF1 by copper electroplating.

The substrates SUB are separated into two sheets, and a resin layer RL10 is laminated on one of the separated substrates SUB so that the plated film PL11 is embedded. Although not illustrated, the resin layer RL10 is laminated on the other of the substrates SUB so that the plated film PL21 is embedded. The plated film PL21 is thinner than the plated film PL11.

The resin layer RL10 on one of the substrates SUB and the resin layer RL10 on the other of the substrates SUB are faced and hot-pressed.

The surfaces of the substrates SUB are covered with protection films (not illustrated), and then a hole H is formed.

The substrates SUB on both surfaces are removed and a resist film RF is formed on one surface.

The structure in this state is subjected to copper electroplating to deposit the plated film PL22 on the exposed plated film PL21.

The resist film RF is removed, and copper electroplating is performed again to deposit the plated film PL12 on the plated film PL11. In addition, the plated film PL22 is thickened.

A metal catalyst is adsorbed on the inner wall of the hole H, and copper electroplating is performed again to form a plated film on the inner wall of the hole H.

Thereafter, the resin layers RL21 and RL22 are printed. Concurrently, a resin is disposed in the hole H.

In the above-described steps, the multilayer substrate 107 is formed. In FIGS. 10 and 11, the resist film RF1 corresponds to a "first resin substrate", and the resist film RF2 corresponds to a "second resin substrate". The resin layers RL10 correspond to "bonding layers". The plated films PL12, PL11, PL21, and PL22 respectively correspond to a "first conductor pattern", a "second conductor pattern", a "third conductor pattern", and a "fourth conductor pattern".

According to the present preferred embodiment, a portion of the conductor patterns is embedded in the resin substrates. In this structure, the thickness of the portion of the conductor patterns embedded in the resin substrates (specifically, the thickness of the resin substrates) also defines the thickness of the plated films. Therefore, when the distance between conductor patterns adjacent to each other in the lamination direction is left unchanged, the conductor patterns are able to have a larger cross-sectional area, accordingly. Thus, a multilayer substrate including coil conductor patterns having a small conductor loss is able to be obtained. When the cross-sectional areas of the conductor patterns are left unchanged, the distance between the conductor patterns adjacent in the lamination direction is able to be increased.

The conductor patterns disposed on both surfaces of the resin substrate may be connected together with interlayer connection conductors disposed at a plurality of portions. In this structure, the conductor patterns are connected in parallel in the lamination direction. Thus, a multilayer substrate including conductor patterns having a small conductor loss is able to be obtained.

The present invention is not limited to the above-described preferred embodiments. For example, in the above description, the plated films are preferably deposited by electroplating. However, the plated film may be deposited by electroless plating.

The conductor patterns may be made of films that are plated and then ground by a predetermined thickness so as to have a uniform or substantially uniform thickness, instead of the plated films without being processed.

In the above description, the resin substrates 1 and 2, the bonding layer 10, and the resin substrates 21 and 22 are preferably made of a liquid crystal polymer, but may be a polyimide resin or epoxy resin, for example.

Multilayer substrates according to preferred embodiments of the present invention are not limited to a coil device and are applicable to any of various types of electric components, such as antennas, actuators, or sensors. A multilayer substrate according to a preferred embodiment of the present invention may be a chip component, such as a chip inductor, for example. Thus, preferred embodiments of the present invention may be appropriately changed within the range not departing from the gist of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate, comprising:
   a plurality of resin substrates;
   a bonding layer disposed between resin substrates of the plurality of resin substrates adjacent to each other in a lamination direction in which the plurality of resin substrates are laminated; and
   a plurality of conductor patterns provided on both surfaces of the plurality of resin substrates, and including a surface defined by a plated film; wherein
   the plurality of resin substrates include:
      a first resin substrate including a first surface and a second surface opposite to the first surface; and
      a second resin substrate including a third surface facing the second surface and a fourth surface opposite to the third surface;
   the plurality of conductor patterns include:
      a first conductor pattern disposed on the first surface and including a surface defined by a plated film;
      a second conductor pattern disposed on the second surface and including a surface defined by a plated film;
      a third conductor pattern disposed on the third surface and including a surface defined by a plated film; and
      a fourth conductor pattern disposed on the fourth surface and including a surface defined by a plated film;
   the first conductor pattern is located closer to a first outermost layer than the second conductor pattern; and
   T1<T2 and T3<T4, where T1 denotes a thickness of the first conductor pattern, T2 denotes a thickness of the second conductor pattern, T3 denotes a thickness of the third conductor pattern, and T4 denotes a thickness of the fourth conductor pattern.

2. The multilayer substrate according to claim 1, wherein the thickness T1 of the first conductor pattern is smaller than the thickness T3 of the third conductor pattern.

3. The multilayer substrate according to claim 1, wherein
the plurality of conductor patterns include a thick conductor pattern and a thin conductor pattern, which are provided in accordance with surfaces on which the conductor patterns are disposed; and
of the conductor patterns facing each other with the bonding layer interposed therebetween, the thick conductor pattern faces the thin conductor pattern.

4. The multilayer substrate according to claim 1, wherein
the plurality of resin substrates include:
a third resin substrate including a fifth surface and a sixth surface opposite to the fifth surface; and
a fourth resin substrate including a seventh surface facing the sixth surface and an eighth surface opposite to the seventh surface;
the plurality of conductor patterns include:
a fifth conductor pattern disposed on the fifth surface and including a surface defined by a plated film;
a sixth conductor pattern disposed on the sixth surface and including a surface defined by a plated film;
a seventh conductor pattern disposed on the seventh surface and including a surface defined by a plated film; and
an eighth conductor pattern disposed on the eighth surface and including a surface defined by a plated film;
the fifth conductor pattern is located closer to a second outermost layer than the sixth conductor pattern is;
the fifth conductor pattern, the sixth conductor pattern, the seventh conductor pattern, and the eighth conductor pattern include overlapping portions when viewed in the lamination direction and are arranged along each other; and
T5<T6 and T7<T8, where T5 denotes a thickness of the fifth conductor pattern, T6 denotes a thickness of the sixth conductor pattern, T7 denotes a thickness of the seventh conductor pattern, and T8 denotes a thickness of the eighth conductor pattern.

5. The multilayer substrate according to claim 1, wherein the conductor patterns provided on both surfaces of the plurality of resin substrates are electrically connected with each other via interlayer connection conductors at a plurality of portions to be connected in parallel.

6. The multilayer substrate according to claim 1, further comprising:
a terminal electrode disposed on a mount surface of a lamination body defined by the plurality of resin substrates and the bonding layer being laminated together, the mount surface being located closer to the second resin substrate than to the first resin substrate.

7. A structure of a multilayer substrate mounted on a circuit board, comprising:
the multilayer substrate according to claim 6; and
a circuit board on which the multilayer substrate is mounted; wherein
the terminal electrode is connected to a pad electrode disposed on the circuit board.

8. The structure of a multilayer substrate mounted on a circuit board according to claim 7, wherein the thickness T1 of the first conductor pattern is smaller than the thickness T3 of the third conductor pattern.

9. The structure of a multilayer substrate mounted on a circuit board according to claim 7, wherein
the plurality of conductor patterns include a thick conductor pattern and a thin conductor pattern, which are provided in accordance with surfaces on which the conductor patterns are disposed; and
of the conductor patterns facing each other with the bonding layer interposed therebetween, the thick conductor pattern faces the thin conductor pattern.

10. The structure of a multilayer substrate mounted on a circuit board according to claim 7, wherein
the plurality of resin substrates include:
a third resin substrate including a fifth surface and a sixth surface opposite to the fifth surface; and
a fourth resin substrate including a seventh surface facing the sixth surface and an eighth surface opposite to the seventh surface;
the plurality of conductor patterns include:
a fifth conductor pattern disposed on the fifth surface and including a surface defined by a plated film;
a sixth conductor pattern disposed on the sixth surface and including a surface defined by a plated film;
a seventh conductor pattern disposed on the seventh surface and including a surface defined by a plated film; and
an eighth conductor pattern disposed on the eighth surface and including a surface defined by a plated film;
the fifth conductor pattern is located closer to a second outermost layer than the sixth conductor pattern;
the fifth conductor pattern, the sixth conductor pattern, the seventh conductor pattern, and the eighth conductor pattern include overlapping portions when viewed in the lamination direction and are arranged along each other; and
T5<T6 and T7<T8, where T5 denotes a thickness of the fifth conductor pattern, T6 denotes a thickness of the sixth conductor pattern, T7 denotes a thickness of the seventh conductor pattern, and T8 denotes a thickness of the eighth conductor pattern.

11. The structure of a multilayer substrate mounted on a circuit board according to claim 7, wherein the conductor patterns provided on both surfaces of the plurality of resin substrates are electrically connected with each other via interlayer connection conductors at a plurality of portions to be connected in parallel.

12. A method for mounting the multilayer substrate according to claim 6 on a circuit board, comprising:
heating with a hot bar a surface of the multilayer substrate opposite to a surface on which the terminal electrode is disposed to connect the terminal electrode to a pad electrode disposed on the circuit board.

13. The method according to claim 12, wherein the thickness T1 of the first conductor pattern is smaller than the thickness T3 of the third conductor pattern.

14. The method according to claim 12, wherein
the plurality of conductor patterns include a thick conductor pattern and a thin conductor pattern, which are provided in accordance with surfaces on which the conductor patterns are disposed; and
of the conductor patterns facing each other with the bonding layer interposed therebetween, the thick conductor pattern faces the thin conductor pattern.

15. The method according to claim 12, wherein
the plurality of resin substrates include:
a third resin substrate including a fifth surface and a sixth surface opposite to the fifth surface; and a fourth resin substrate including a seventh surface facing the sixth surface and an eighth surface opposite to the seventh surface;

the plurality of conductor patterns include:

a fifth conductor pattern disposed on the fifth surface and including a surface defined by a plated film;

a sixth conductor pattern disposed on the sixth surface and including a surface defined by a plated film;

a seventh conductor pattern disposed on the seventh surface and including a surface defined by a plated film; and an eighth conductor pattern disposed on the eighth surface and including a surface defined by a plated film;

the fifth conductor pattern is located closer to a second outermost layer than the sixth conductor pattern is;

the fifth conductor pattern, the sixth conductor pattern, the seventh conductor pattern, and the eighth conductor pattern include overlapping portions when viewed in the lamination direction and are arranged along each other; and $T5<T6$ and $T7<T8$, where $T5$ denotes a thickness of the fifth conductor pattern, $T6$ denotes a thickness of the sixth conductor pattern, $T7$ denotes a thickness of the seventh conductor pattern, and $T8$ denotes a thickness of the eighth conductor pattern.

16. The method according to claim 12, wherein the conductor patterns provided on both surfaces of the plurality of resin substrates are electrically connected with each other via interlayer connection conductors at a plurality of portions to be connected in parallel.

17. A method for manufacturing a multilayer substrate, comprising:

a base pattern forming step of forming base patterns on both surfaces of a plurality of resin substrates by patterning copper foil, each of the base patterns defining the same plane and having a uniform thickness;

a plating step of growing a copper-plated film on the base patterns; and a lamination body forming step of laminating and thermocompression-bonding together the plurality of resin substrates with a bonding layer interposed therebetween to form a lamination body; wherein the plurality of resin substrates include:

a first resin substrate including a first surface and a second surface opposite to the first surface;

a second resin substrate including a third surface facing the second surface and a fourth surface opposite to the third surface;

a third resin substrate including a fifth surface and a sixth surface opposite to the fifth surface; and a fourth resin substrate including a seventh surface facing the sixth surface and an eighth surface opposite to the seventh surface;

the first surface is located closer to a first outermost layer of the lamination body than the second surface is, and the fifth surface is located closer to a second outermost layer of the lamination body than the sixth surface is;

a first conductor pattern, disposed on the first surface and including a corresponding one of the base patterns and a corresponding one of the plated films, a second conductor pattern, disposed on the second surface and including a corresponding one of the base patterns and a corresponding one of the plated films, a third conductor pattern, disposed on the third surface and including a corresponding one of the base patterns and a corresponding one of the plated films, and a fourth conductor pattern disposed on the fourth surface and including a corresponding one of the base patterns and a corresponding one of the plated films, include overlapping portions when viewed in a lamination direction and are arranged along each other;

a fifth conductor pattern, disposed on the fifth surface and including a corresponding one of the base patterns and a corresponding one of the plated films, a sixth conductor pattern, disposed on the sixth surface and including a corresponding one of the base patterns and a corresponding one of the plated films, a seventh conductor pattern, disposed on the seventh surface and including a corresponding one of the base patterns and a corresponding one of the plated films, and an eighth conductor pattern, disposed on the eighth surface and including a corresponding one of the base patterns and a corresponding one of the plated films, include overlapping portions when viewed in the lamination direction and are arranged along each other; and $T1<T2$, $T3<T4$, $T5<T6$, and $T7<T8$, where $T1$ denotes a thickness of the first conductor pattern, $T2$ denotes a thickness of the second conductor pattern, $T3$ denotes a thickness of the third conductor pattern, $T4$ denotes a thickness of the fourth conductor pattern, $T5$ denotes a thickness of the fifth conductor pattern, $T6$ denotes a thickness of the sixth conductor pattern, $T7$ denotes a thickness of the seventh conductor pattern, and $T8$ denotes a thickness of the eighth conductor pattern.

* * * * *